(12) United States Patent
Koga

(10) Patent No.: US 7,510,081 B2
(45) Date of Patent: Mar. 31, 2009

(54) ELECTRONIC COMPONENT TRAY AND IDENTIFICATION METHOD OF SIMILAR ELECTRONIC COMPONENT TRAY

(75) Inventor: Koji Koga, Kawasaki (JP)

(73) Assignee: Kabuhsiki Kaisha Toshiba, Tokyo (JP)

( * ) Notice: Subject to any disclaimer, the term of this patent is extended or adjusted under 35 U.S.C. 154(b) by 271 days.

(21) Appl. No.: 11/448,902

(22) Filed: Jun. 8, 2006

(65) Prior Publication Data
US 2006/0278563 A1 Dec. 14, 2006

(30) Foreign Application Priority Data
Jun. 8, 2005 (JP) ............................ P2005-168376

(51) Int. Cl.
*B65D 85/00* (2006.01)
(52) U.S. Cl. .................................... 206/701; 206/459.5
(58) Field of Classification Search ........................ None
See application file for complete search history.

(56) References Cited

U.S. PATENT DOCUMENTS

| 2004/0181938 A1 | 9/2004 | Suzuki et al. |
| 2004/0185156 A1* | 9/2004 | Garwood .................... 426/398 |
| 2005/0004702 A1* | 1/2005 | McDonald .................. 700/213 |

FOREIGN PATENT DOCUMENTS

| JP | 9-188383 | 7/1997 |
| JP | 2001-287785 | 10/2001 |
| JP | 2004-284601 | 10/2004 |

OTHER PUBLICATIONS

Office Action issued by the Chinese Patent Office on Nov. 2, 2007, for Chinese Patent Application No. 2006100879508, and English-language Summary thereof.

* cited by examiner

*Primary Examiner*—Jacob K Ackun, Jr.
(74) *Attorney, Agent, or Firm*—Finnegan, Henderson, Farabow, Garrett & Dunner, L.L.P.

(57) ABSTRACT

An electronic component tray includes: a tray main body housing an electronic component; and a mark provided by the tray main body to represent mass of the tray main body.

12 Claims, 2 Drawing Sheets

ELECTRONIC COMPONENT TRAY AND IDENTIFICATION METHOD OF SIMILAR ELECTRONIC COMPONENT TRAY

CROSS-REFERENCE TO THE INVENTION

This application is based upon and claims the benefit of priority from the prior Japanese Patent Application No. 2005-168376, filed on Jun. 8, 2005; the entire contents of which are incorporated herein by reference.

BACKGROUND OF THE INVENTION

1. Field of the Invention

The present invention relates to an electronic component tray and an identification method of a similar electronic component tray.

2. Description of the Related Art

Conventionally, an electronic component tray (hereinafter, referred to as a "tray") has been sometimes used when electronic components such as semiconductor devices are delivered to a customer. In recent years, used trays are reused in view of environmental protection and the like.

Concretely, used trays are collected from customers, and usable trays are sorted by electronic component maker to be returned to respective electronic component makers. The electronic component maker puts electronic components in the returned trays again and delivers the electronic components to customers. The trays are sorted based on inscribed product names, maker's names, or the like, or based on the appearance such as the arrangement of resin inlet traces.

Currently, trays properly made by some makers (hereinafter, referred to as "proper trays") are followed by a large number of trays (hereinafter, referred to as "similar trays") that are produced by different makers but are identical or closely similar to the proper trays, not only in shape but also in inscribed product name or maker's name, the arrangement of resin inlet traces, and so on.

Constituent materials of these similar trays are unknown and possibly contain, for example, toxic substances and the like having a damaging effect on the environment. Therefore, it is not desirable to put electronic components in returned trays including similar trays to deliver them to customers. The included similar trays may possibly be a cause of loss of reliability from the customers.

Under such circumstances, it is necessary to identify similar trays that might be included in the returned trays. However, the identification of similar trays based on their appearance is difficult since even the inscribed maker's names and the like are identical or closely similar as described above.

There is disclosed an art to bury an electronic tag in a tray, the electronic tag being made of a mu-chip storing information on a tray such as its ID, maker's name and product number, and information on electronic components such as their product name, quantity, and lot number (see JP-A 2004-284601 (KOKAI)). However, burying the electronic tag in the tray is not practical since it requires a lot of trouble and increases cost.

There is disclosed another art in which a mark for identifying the type or the like of electronic components is borne on a side face of a tray (see, for example, JP-A 9-188383 (KOKAI)). However, this mark is not for enabling the identification of a similar tray but for enabling easy discrimination on the type of electronic components to be put in the tray even when the trays are in a stacked state. Further, if this mark is also imitated, it is difficult to identify a proper tray from a similar tray.

SUMMARY OF THE INVENTION

The present invention was made to solve the aforesaid problems. That is, it is an object of the present invention to provide an electronic component tray and an identification method of a similar electronic component tray which enable easy identification of a similar electronic component tray.

An electronic component tray according to an aspect of the present invention includes: a tray main body for housing an electronic component; and a mark provided by the tray main body to represent mass of the tray main body.

An identification method of an electronic component tray providing a mark according to another aspect of the present invention includes: measuring mass of the tray; and judging whether or not the measured mass falls within a tolerance range determined based on the mark.

DESCRIPTION OF THE EMBODIMENTS

Figure 1:
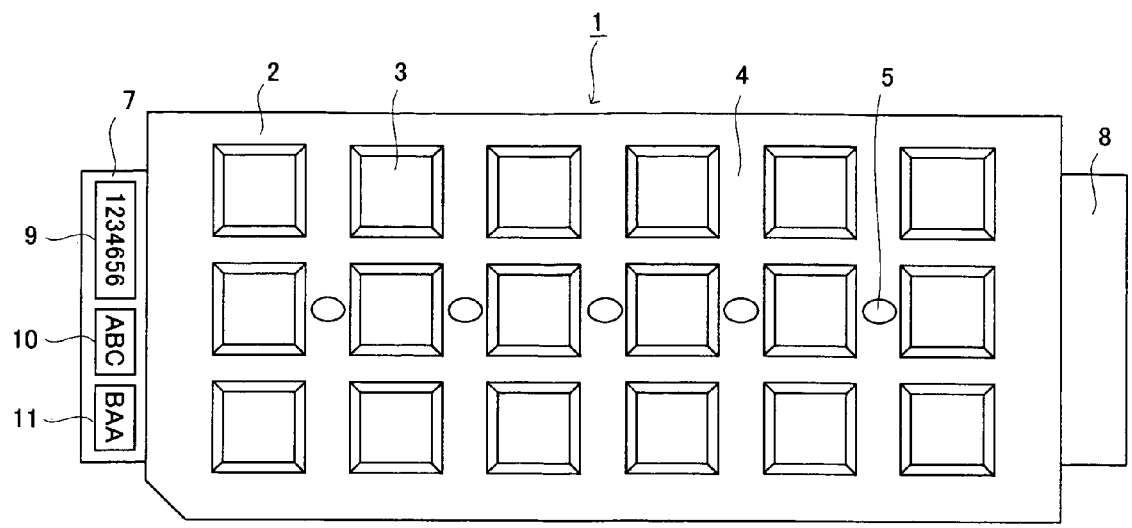
FIG. 1 is a schematic plane view of a proper electronic component tray according to an embodiment.

Hereinafter, embodiments will be described with reference to the drawings. FIG. 1 is a schematic plane view of a proper electronic component tray according to this embodiment, and FIG. 2 is a schematic vertical cross-sectional view of the proper tray according to this embodiment.

Figure 2:
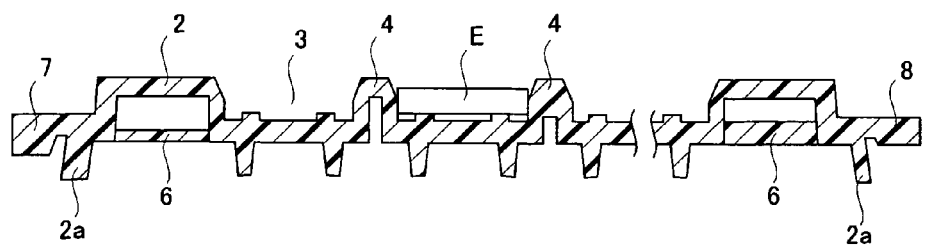
FIG. 2 is a schematic vertical cross-sectional view of the proper tray according to the embodiment.

As shown in FIG. 1 and FIG. 2, a proper tray 1 includes a tray main body 2 in a rectangular shape. The proper tray 1 is formed by, for example, injection molding of resin.

The tray main body 2 has, on a front face side thereof, a plurality of pockets 3 for housing electronic components E such as semiconductor devices. The plural pockets 3 are arranged in a grid pattern.

A plurality of grid bars 4 connecting the pockets 3 are formed between the different pockets 3. As shown in FIG. 2, some (for example, several parts) of the grid bars 4 are thicker than the other grid bars 4. What matters is that some of the grid bars 4 are different in thickness from the other grid bars 4, and some of the grid bars 4 may be thinner than the other grid bars 4. At predetermined places of upper surfaces of the grid bars 4, there are resin injection inlet traces 5 that were used as resin injection inlets.

On a rear face of an outer peripheral part of the tray main body 2, depressions are formed. In these depressions, reinforcing ribs 6 are formed to increase the strength of the proper tray 1. As shown in FIG. 2, some (for example, several parts) of the reinforcing ribs 6 are thicker than the other reinforcing ribs 6. What matters is that some of the reinforcing ribs 6 are different in thickness from the other reinforcing ribs 6, and some of the reinforcing ribs 6 may be thinner than the other reinforcing ribs 6.

An outer peripheral edge part 2a of the tray main body 2 protrudes downward. As shown in FIG. 2, some portions of the outer peripheral edge part 2a are thicker than the other portions of the outer peripheral part 2a. What matters is that some portions of the outer peripheral edge part 2a are different in thickness from the other portions of the outer peripheral edge part 2a, and some portions of the outer peripheral edge part 2a may be thinner than the other portions of the outer peripheral edge part 2a.

The tray main body 2 has, at both longitudinal end portions thereof, hold parts 7, 8 which are held when the proper tray 1 is transferred. As shown in FIG. 2, the hold portion 7 is thicker than the hold portion 8. What matters is that the hold portion 7 is different in thickness from the hold portion 8, and the hold portion 7 may be thinner than the hold portion 8.

On a front face of the hold portion 7, for example, a product name 9, a maker's name 10, a mark 11 representing the mass of the proper tray 1, and so on are inscribed. The mark 11 is a cipher representing the mass. For example, the mark 11 includes at least one of a character such as an alphabetical letter, a numeral, a sign, a picture, and the like. Another usable mark is a one-dimensional code such as a barcode or a two-dimensional code such as an QR code. Another example usable instead of an optical mark is a magnetic mark, for example, a magnetic code.

Concretely, for example, in a case where the mass of the proper tray 1 is 100 g, "BAA" as the mark 11 that is an enciphered mass "100 g" (here, "A" represents 0 and "B" represents 1) is borne on the hold portion 7. Instead of using a cipher as the mark 11, the hold part 7 may bear the numerals "100" directly representing the mass of the proper tray 1. Further, the mark 11 representing the mass of the proper tray 1 only needs to be borne on some place of the proper tray 1. For example, the mark 11 may be borne on an inscription tab or the like. Alternatively, instead of being inscribed on the proper tray 1, the mark 11 may be printed on the proper tray 1. Further, a sheet on which the mark 11 is, for example, printed may be pasted on the proper tray 1.

Hereinafter, an identification method of a similar tray will be described. Note that the similar tray is defined as a tray being identical in shape to the proper tray 1 and bearing a product name, a maker's name, a mark, and so on that are all identical or closely similar to those of the proper tray 1.

First, a mark, which is a cipher, borne on a tray is deciphered, whereby the mass of the tray is found. Further, a tolerance range is set. The tolerance range includes the found mass, and a tray having the mass falling within the tolerance range is recognized as the proper tray 1. For example, in a case where the mass of the proper tray 1 is found to be 100 g based on the mark borne on the proper tray 1, the tolerance range is set as not less than 99 g nor greater than 101 g. For example, by referring to a table showing the mass and the tolerance range in correspondence to each other, it is possible to set this tolerance range. Alternatively, a range obtained by multiplying the mass by a predetermined tolerance ratio (for example, ±1%) may be set as the tolerance range.

Next, the mass of the tray is actually measured. Finally, it is judged whether or not the actually measured mass of the tray falls within the tolerance range.

Here, if the measured tray is the proper tray 1, the actually measured mass thereof is substantially equal to the mass found by deciphering the mark 11. Therefore, if the tray is the proper tray 1, the measured mass highly possibly falls within the tolerance range.

On the other hand, if the measured tray is a similar tray, the actually measured mass thereof is not equal to the mass found by deciphering the mark. This is because a constituent material of the similar tray is very much likely to differ from a constituent material of the proper tray 1 even if the shape, the mark, and the like of a similar tray are identical or closely similar to the shape, the mark, and the like of the proper tray 1. Therefore, if the tray is a similar tray, it is highly possible that the measured mass does not fall within the tolerance range. In this manner, it is judged whether or not the tray is a similar tray.

In this embodiment, the proper tray 1 bears the mark 11 representing the mass of the proper tray 1. Therefore, only by measuring the mass of a tray, it is possible to judge whether or not the tray is a similar tray. Even in a case where a similar tray is identical to the proper tray 1 in shape and bears a mark identical or closely similar to that of the proper tray 1, it is possible to identify the similar tray. In a case where a similar tray does not bear a mark representing the mass or bears a mark not closely similar to that of the proper tray 1, there is no need to measure the mass, and its appearance can serve as a basis for identifying a similar tray.

Figure 3:
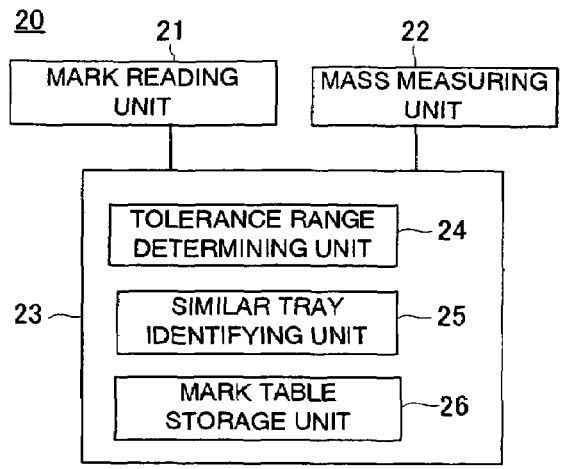
FIG. 3 is a block diagram of an identifying apparatus of an electronic component tray according to the embodiment.

The identification process of a similar tray can be implemented by either human work or mechanical work. FIG. 3 is a block diagram showing a similar tray identifying apparatus 20.

The similar tray identifying apparatus 20 enables automatic identification of a similar tray and includes a mark reading unit 21, a mass measuring unit 22, and an identifying apparatus main body 23.

The mark reading unit 21 is a reader of a mark on a tray, and is, for example, an optical character reader (OCR), a code reader (for example, a barcode reader), or a magnetic reader. A reader appropriate for the type of a mark is used. The mark reading unit 21 reads the mark 11 on a tray to output information on the mark 11.

The mass measuring unit 22 is a device measuring the mass of a tray and is, for example, a mass meter. The mass measuring unit 22 measures the mass of a tray to output information on the mass.

The identifying apparatus main body 23 is a device to identify a similar tray based on the information outputted from the mark reading unit 21 and the mass measuring unit 22 and is constituted of, for example, a computer. The identifying apparatus main body 23 has a tolerance range determining unit 24, a similar tray identifying unit 25, a mark table storage unit 26.

The tolerance range determining unit 24 determines the tolerance range of the mass based on the mark 11 of a tray. A mark dictionary is used for this determination.

The similar tray identifying unit 25 identifies a similar tray based on the relation between the mass of the tray and the tolerance range or based on the mark 11 itself of the tray.

The mark table storage unit 26 is a memory device storing the mark dictionary and is, for example, a hard disk. The mark dictionary is a dictionary for use in deciphering the mark 11 and shows the correspondence relation between the mark and the mass. It is used when a cipher of the mark 11 is deciphered.

Figure 4:
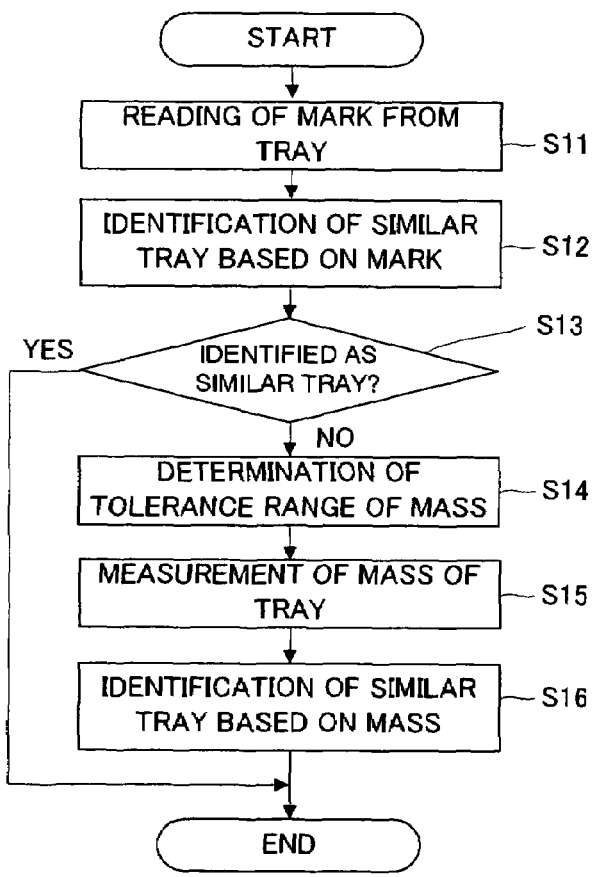
FIG. 4 is a flowchart of an identification method of an electronic component tray according to the embodiment.

FIG. 4 is a flowchart showing the procedure for the similar tray identification by the similar tray identifying apparatus 20. Hereinafter, the procedure for the similar tray identification will be described in detail based on FIG. 4.

(1) Reading of the mark 11 of a tray (Step S11) The mark reading unit 21 reads the mark 11 on a tray. Another possible way is that a person reads the mark 11 to input the read mark 11 to the similar tray identifying apparatus 20.

(2) Identification of a similar tray based on the mark 11 (Steps S12, S13)

Based on the read mark 11, it is judged whether or not the tray is a similar tray. By referring to the mark dictionary, it is judged whether or not information on the mass corresponding to the mark 11 exists. If the information on the mass corresponding to the mark 11 does not exist, the tray is identified as a similar tray. If the tray is identified as a similar tray, the identification processing for this tray is finished (Step S13).

(3) Determination of the tolerance range of the mass (Step S14)

Based on the read mark 11, the tolerance range of the mass is determined. At this time, the following processes 1), 2) are executed.

1) The information on the mass corresponding to the read mark 11 is deciphered, by using the mark dictionary. Another possible way to find the mass is to refer to a table showing the mark 11 and the mass in correspondence to each other (mark-mass table). This table can be stored in the mark table storage unit 26, in place of the mark dictionary or together with the mark dictionary. Likewise, later-described tables (mass-tolerance range table, mark-tolerance range table) can be also stored in the mark table storage unit 26.

2) Based on the mass found by the deciphering, the tolerance range of the mass is determined. An example of a method to determine the tolerance range is to multiply the mass by a predetermined tolerance ratio (for example, ±1%). An alternative method to determine the tolerance range is to refer to the table (mass-tolerance range table) showing the mass and the tolerance range in correspondence to each other.

3) Another method in place of the aforesaid 1) and 2) is to determine the tolerance range of the mass directly based on the mark 11. For example, it is possible to obtain information on the tolerance range directly based on the information on the mark 11, by the use of the table (mark-tolerance range table) showing the mark 11 and the tolerance range of the mass in correspondence to each other.

(4) Measurement of the mass of the tray (Step S15) The mass measuring unit 22 measures the mass of the tray.

(5) Identification of a similar tray based on the mass (Step S16)

A similar tray is identified based on whether or not the measured mass falls within the tolerance range.

The order of the above-described processing procedures is changeable. For example, Step S15 can come prior to Step S11. Further, Steps S11, S15 may proceed in parallel simultaneously. The parallel simultaneous execution of Steps S11, S15 results in a higher processing speed.

It is premised that the above-described processing procedure is executed by the similar tray identifying apparatus 20. Part or all of the processing procedure can be executed by human work. A possible example is that a person reads the mark 11 or measures the mass to input the result to the similar tray identifying apparatus 20.

In this embodiment, the mass of the mark 11 is a cipher representing the mass of the proper tray 1. Therefore, it is not easily noticed that the mark 11 represents the mass of the proper tray 1. As a result, it is possible to prevent manufacture of a skillfully forged similar tray.

In this embodiment, some portions of the constituent elements of the proper tray 1 are changed in thickness, which makes it possible to adjust the mass of the proper tray 1 to a desired mass. Concretely, the thickness of part of the grid bars 4, the reinforcing ribs 6, and the outer peripheral edge part 2a and the thickness of the hold portion 7 are changed. As a result, for example, the proper tray 1 can be made heavier by about 5 g compared with a case where the thickness is not changed.

This makes it possible to make the proper tray 1 and a similar tray different in mass, which can facilitate identifying the similar tray. For example, even in a case where not only the shape, the mark representing the mass, and the like but also constituent materials are identical or closely similar to those of the proper tray 1, the similar tray can be identified. In this case, it is not easily noticed that the proper tray 1 has portions whose thickness is different from the other portions. This is because the thickness of only part thereof is changed and the change of the thickness is not easily recognizable from the appearance. As a result, manufacture of a more skillfully forged similar tray can be prevented.

(Other Embodiment)

Embodiments of the present invention are not limited to the contents described in the foregoing embodiment. For example, the structure, material, arrangement of each member, and so on can be appropriately changed within a range not departing from the spirit of the present invention. Further, the identification processes of a similar tray can be executed either by human work or by mechanical work.

What is claimed is:

1. An identification method of an electronic component tray having a mark representing a mass of the electronic component tray, comprising:

measuring mass of an electronic component tray;

reading the mark from the tray, the mark representing a mass of the electronic component tray; and judging whether or not the measured mass falls within a tolerance range of the mass represented by the read mark.

2. The identification method of the tray as set forth in claim 1, further comprising:

determining the tolerance range of the mass based on the mark.

3. The identification method of the tray as set forth in claim 1, wherein the mark is a cipher representing the mass.

4. The identification method of the tray as set forth in claim 1, wherein the tray main body has a plurality of pockets disposed on a major surface thereof and a plurality of grid bars disposed between the pockets.

5. The identification method of the tray as set forth in claim 4, wherein the plural grid bars include grid bars different in thickness.

6. The identification method of the tray as set forth in claim 4, wherein the tray main body further has a plurality of reinforcing ribs disposed on a surface opposite the major surface.

7. The identification method of the tray as set forth in claim 6, wherein the plural reinforcing ribs include reinforcing ribs different in thickness.

8. The identification method of the tray as set forth in claim 1, further comprising:

comparing the information read from the tray with the measured mass of the electronic component tray.

9. The identification method of the tray as set forth in claim 1, further comprising:

deciding the tolerance range before measuring mass of an electronic component tray.

10. The identification method of the tray as set forth in claim 1, wherein reading the mark from the tray is provided after measuring mass of the electronic component tray.

11. The identification method of the tray as set forth in claim 8, further comprising:

deciding the tolerance range before measuring mass of an electronic component tray.

12. The identification method of the tray as set forth in claim 1, further comprising:

deciding the tolerance range before reading the mark from the tray.

* * * * *